(12) United States Patent
Lee

(10) Patent No.: US 11,264,349 B2
(45) Date of Patent: Mar. 1, 2022

(54) SEMICONDUCTOR DIE WITH CAPILLARY FLOW STRUCTURES FOR DIRECT CHIP ATTACHMENT

(71) Applicant: Micron Technology, Inc., Boise, ID (US)

(72) Inventor: Jungbae Lee, Taichung (TW)

(73) Assignee: Micron Technology, Inc., Boise, ID (US)

( * ) Notice: Subject to any disclaimer, the term of this patent is extended or adjusted under 35 U.S.C. 154(b) by 46 days.

(21) Appl. No.: 16/721,477

(22) Filed: Dec. 19, 2019

(65) Prior Publication Data

US 2021/0193610 A1 Jun. 24, 2021

(51) Int. Cl.
*H01L 23/00* (2006.01)

(52) U.S. Cl.
CPC .............. *H01L 24/32* (2013.01); *H01L 24/13* (2013.01); *H01L 24/16* (2013.01); *H01L 24/73* (2013.01); *H01L 2224/10122* (2013.01); *H01L 2224/13147* (2013.01); *H01L 2224/13611* (2013.01); *H01L 2224/13639* (2013.01); *H01L 2224/26145* (2013.01); *H01L 2224/73204* (2013.01)

(58) Field of Classification Search
CPC ....................................................... H01L 24/32
See application file for complete search history.

(56) References Cited

U.S. PATENT DOCUMENTS

| | | | | |
|---|---|---|---|---|
| 5,056,215 A | * | 10/1991 | Blanton | H05K 3/303 29/840 |
| 5,633,535 A | * | 5/1997 | Chao | H05K 3/3436 257/778 |
| 6,207,475 B1 | | 3/2001 | Lin et al. | |
| 8,159,067 B2 | * | 4/2012 | Daubenspeck | H01L 24/97 257/738 |

(Continued)

FOREIGN PATENT DOCUMENTS

| TW | 436883 B | 5/2001 |
|---|---|---|
| TW | I427712 B | 2/2014 |

(Continued)

OTHER PUBLICATIONS

ROC (Taiwan) Patent Application No. 109144389—Taiwanese Search Report, dated Oct. 12, 2021, with English Translation, 2 pages.

*Primary Examiner* — William A Harriston
(74) *Attorney, Agent, or Firm* — Perkins Coie LLP

(57) ABSTRACT

A semiconductor device having a capillary flow structure for a direct chip attachment is provided herein. The semiconductor device generally includes a substrate and a semiconductor die having a conductive pillar electrically coupled to the substrate. The front side of the semiconductor die may be spaced a distance apart from the substrate forming a gap. The semiconductor device further includes first and second elongate capillary flow structures projecting from the front side of the semiconductor die at least partially extending toward the substrate. The first and second elongate capillary flow structures may be spaced apart from each other at a first width configured to induce capillary flow of an underfill (Continued)

material along a length of the first and second elongate capillary flow structures. The first and second capillary flow structures may include pairs of elongate capillary flow structures forming passageways therebetween to induce capillary flow at an increased flow rate.

17 Claims, 5 Drawing Sheets

(56) References Cited

U.S. PATENT DOCUMENTS

| | | | |
|---|---|---|---|
| 8,426,247 B2* | 4/2013 | Daubenspeck | ... H01L 23/49811 438/108 |
| 2008/0038870 A1 | 2/2008 | Gupta et al. | |
| 2008/0277802 A1* | 11/2008 | Tsai | ........................ H01L 24/28 257/778 |
| 2010/0038780 A1* | 2/2010 | Daubenspeck | ......... H01L 24/97 257/738 |
| 2014/0134796 A1 | 5/2014 | Kelly et al. | |
| 2016/0005672 A1 | 1/2016 | Dubey et al. | |

FOREIGN PATENT DOCUMENTS

| | | |
|---|---|---|
| TW | I575621 B | 3/2017 |
| TW | I626698 B | 6/2018 |

* cited by examiner

SEMICONDUCTOR DIE WITH CAPILLARY FLOW STRUCTURES FOR DIRECT CHIP ATTACHMENT

TECHNICAL FIELD

The present disclosure is generally directed to semiconductor devices, and in several embodiments to semiconductor dies with capillary flow enhancing structures for direct chip attachment.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. In direct chip attachment (DCA) technology, conventional device packaging is eliminated. Some direct chip attachment technologies include chip-on-board (COB) configurations, where semiconductor dies are directly mounted and electrically interconnected to a substrate, e.g., a printed circuit board (PCB), ceramic substrate, or glass ceramic substrate, among others. The semiconductor dies are electrically coupled to a substrate through a die-to-substrate (D2S) connection, which can include a die with bond pads having pillars and/or solder bumps configured to be mounted to a substrate flipped upside-down with the front-side of the die facing the substrate (e.g., a flip-chip). When a flip-chip is used with the COB configuration, the semiconductor die may be underfilled to protect the active surface and bumps from thermomechanical and chemical damage, and to reduce shear stress that can lead to damage caused by mismatched thermal expansion of the substrate and semiconductor die. The semiconductor die is bonded to the substrate using a non-conductive adhesive underfill material.

FIG. 1A shows a conventional flip-chip semiconductor device 10 that includes a die 12 and one or more interconnect structures, e.g., D2S pillars 20 having solder bumps 22. FIG. 1B shows the semiconductor device 10 after it has been flipped over such that the D2S pillars 20 and solder bumps 22 interface with a substrate 50 to form the D2S electrical connection. The gap between the substrate 50 and the die 12 is underfilled using a non-conductive adhesive applied to the edges of the gap. In many applications, capillary underfill (CUF) action creates a flow 40 of underfill material through the gap such that the flow 40 is generally uniform between the substrate 50 and the die 12. The flow rate of the CUF flow 40 often limits the throughput of COB manufacturing processes.

DETAILED DESCRIPTION

Figure 1A:
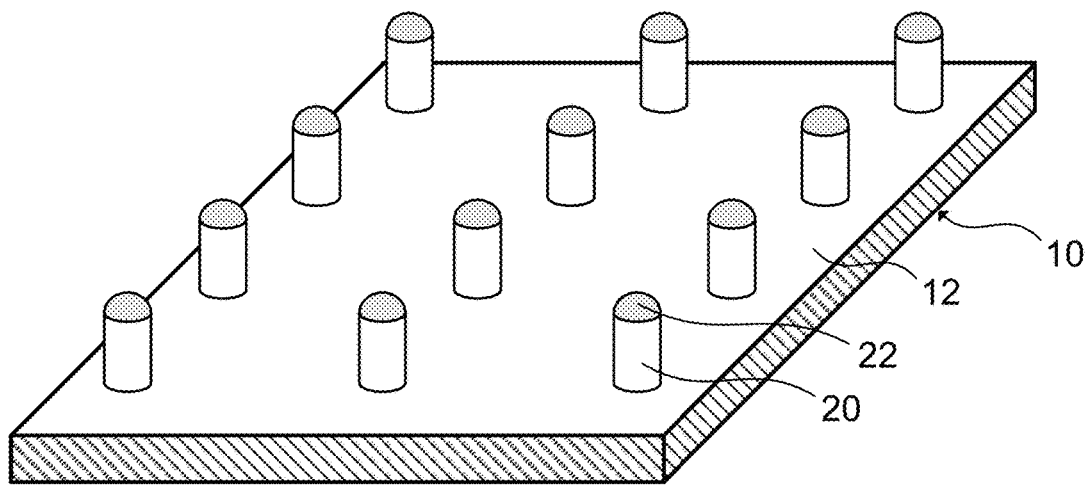
FIG. 1A is an enlarged perspective view showing a semiconductor die configured in accordance with existing technology.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device.

Depending upon the context in which it is used, the term "substrate" can refer to a structure that supports electronic components (e.g., a die), such as a wafer-level substrate or a singulated die-level substrate. The term "substrate" can also mean another die for die-stacking applications. A person having ordinary skill in the relevant art will recognize that suitable aspects of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques.

The present technology includes structures configured to enhance capillary action for increasing the flow rate of underfill material during direct chip attachment processing. Capillary flow structures of the present technology may be on the front side of the die or on the interfacing surface of the substrate, and they are configured to increase flow rate of underfill material through the gap compared to conventional assemblies without the capillary flow structures.

The capillary flow structures may be formed on the surface of the semiconductor die or the surface of the substrate by: (a) plating pattern of capillary flow structures through opening of a photoresist material or a hard mask; (b) attaching pre-formed capillary structures to the surface; (c) depositing a material onto raised portions of the substrate surface; and other suitable techniques. Although the illustrated capillary flow structures are shown having a length extending the majority of the length of the semiconductor die (FIG. 2A), in other embodiments the length of the capillary flow structures is shorter. In some embodiments, multiple capillary flow structures may be used along the length of the semiconductor die. The illustrated capillary flow structures may have a height generally corresponding to the gap distance between the components to contact both the semiconductor die and the substrate during underfilling, or they may only extend partially between the semiconductor die and substrate. In these embodiments, the capillary flow structures may suitably extend greater than 20%, greater than 40%, greater than 60%, greater than 80%, or greater than 90% of the gap distance between the components.

Figure 2A:
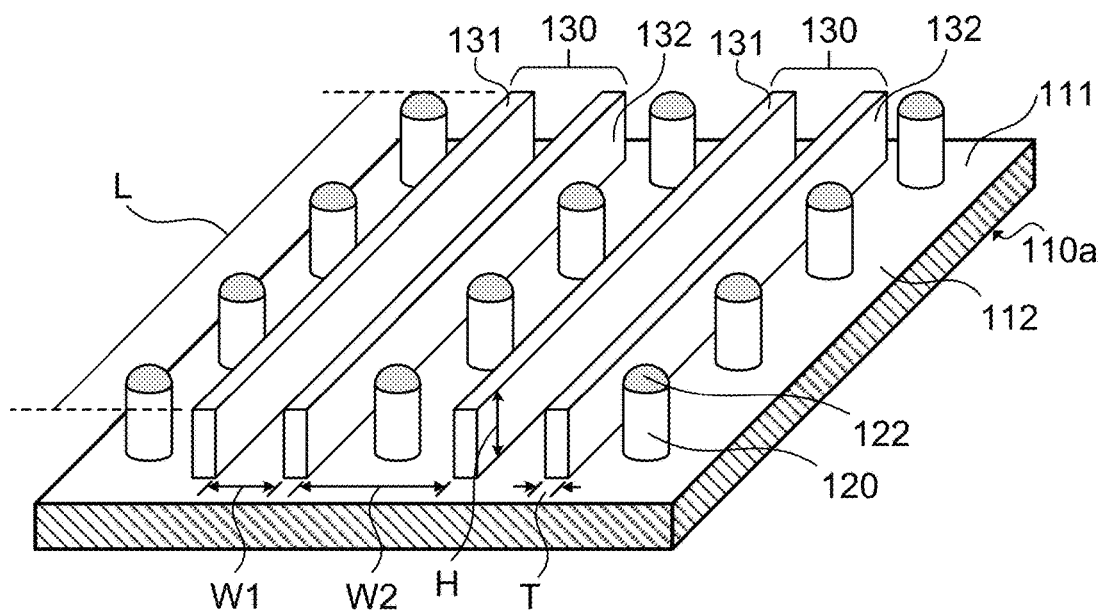
FIG. 2A is an enlarged perspective view showing a semiconductor die having interconnect structures and capillary flow structures configured in accordance with an embodiment of the present technology.

FIG. 2A shows a semiconductor device 110a in a front-side-up configuration. The semiconductor device 110a includes a semiconductor die 112 and pillars 120 extending from a front side 111 of the semiconductor die 112. The pillars 120 may include solder bumps 122 at a distal end of each pillar 120 configured to electrically couple the semiconductor die 112 to a substrate by reflow of the solder bumps 122. The pillars may be formed from suitable conductive materials, such as copper (Cu), and have solder caps to form the electrical connections (e.g., tin-silver (SnAg) solder caps). During assembly, the solder cap is reflowed using gang reflow, sonic reflow, or other techniques. The pillars may be formed using mask processing techniques. The bond pads where the pillars are formed are typically copper such that copper pillars are coupled to the bond pads using copper-to-copper bonding techniques. In other embodiments, the pillars can be formed from a different material than the bond pads, or the pillars can be formed from a combination of materials.

In some embodiments, the semiconductor device 110a further includes capillary flow structures 130 at the front side 111 of the semiconductor die 112. Individual capillary flow structures 130 can include a first flow element 131 and a second flow element 132 that project from the front side 111 of the semiconductor die 112 at a height H. The first and second flow elements 131 and 132 can have a thickness T and a length L. The height H, thickness T, and length L may be adjusted based on (a) the configuration of the semiconductor die 112, (b) the height and spacing of the pillars 120, (c) the desired gap between the semiconductor device 110a and the substrate, (d) the capillary flow structure manufacturing process capabilities, and/or (e) the desired underfill material flow rate, among other considerations.

The first and second flow elements 131 and 132 of each capillary flow structure 130 may be spaced apart by a first distance W1 such that two adjacent capillary flow structures 130 do not straddle any pillars 120. The capillary flow structures 130 may be spaced from each other by a second distance W2 such that two adjacent capillary flow structures 130 are positioned on either side of at least one pillar 120. The first distance W1 can be less than the second distance W2 in many applications. The relative distances W1 and W2 are a function of the available real estate on the die, the arrangement of the pillars 120, and the distances that enhance capillary action of the particular underfill material. For example, since the capillary flow rate of a fluid generally increases inversely with the size of the effective area of the passageway through which the fluid flows, the widths W1 and W2 may be configured to increase the flow rate of the underfill material compared to devices without the capillary flow structures 130. Any number of capillary flow structures 130 may be used in accordance with embodiments of the present technology.

The first and second flow elements 131 and 132 can be made of a material that "wets" well with the type of underfill material. In many applications, the first and second flow elements 131 and 132 can include a metal or metal alloy, such as copper or aluminum. In such applications, the first and second flow elements 131 and 132 may be electrically isolated from the conductive circuitry of the semiconductor die 112. The first and second flow elements 131 and 132 can alternatively include silicon, glass, or other materials with a smooth surface that interfaces well with the underfill material for increasing the capillary force. The first and second flow elements 131 and 132 can be a solid metal, ceramic or polymeric material that wets well with the underfill material, or they may have core and be coated with a material that wets well with the underfill material.

Figure 2B:
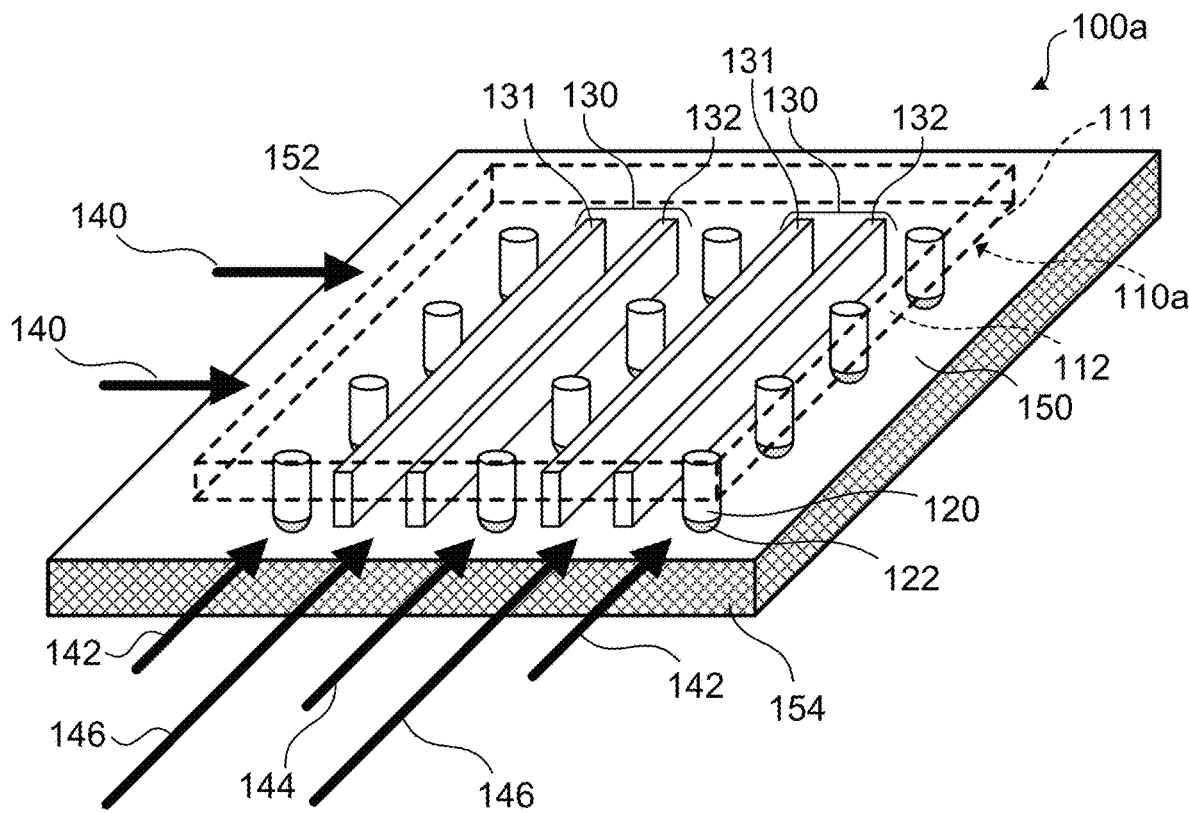
FIG. 2B is an enlarged perspective view showing the semiconductor die of FIG. 2A mounted as a flip-chip to a substrate.

FIG. 2B shows a direct chip attachment assembly 100a having the semiconductor device 110a of FIG. 2A inverted such that the solder bumps 122 interface with contacts (not shown) on a substrate 150. In this configuration, the pillars 120 and solder bumps 122 are electrically connected to the substrate 150 and the capillary flow structures 130 are in a gap between the substrate 150 and the semiconductor die 112. In operation, an underfill material applied at a perimeter of the semiconductor die 112 in the gap between the semiconductor die 112 and the substrate 150 will flow at different rates depending on the geometry of the capillary flow structures 130 and where the underfill material is applied along the semiconductor die 112.

Figure 1B:
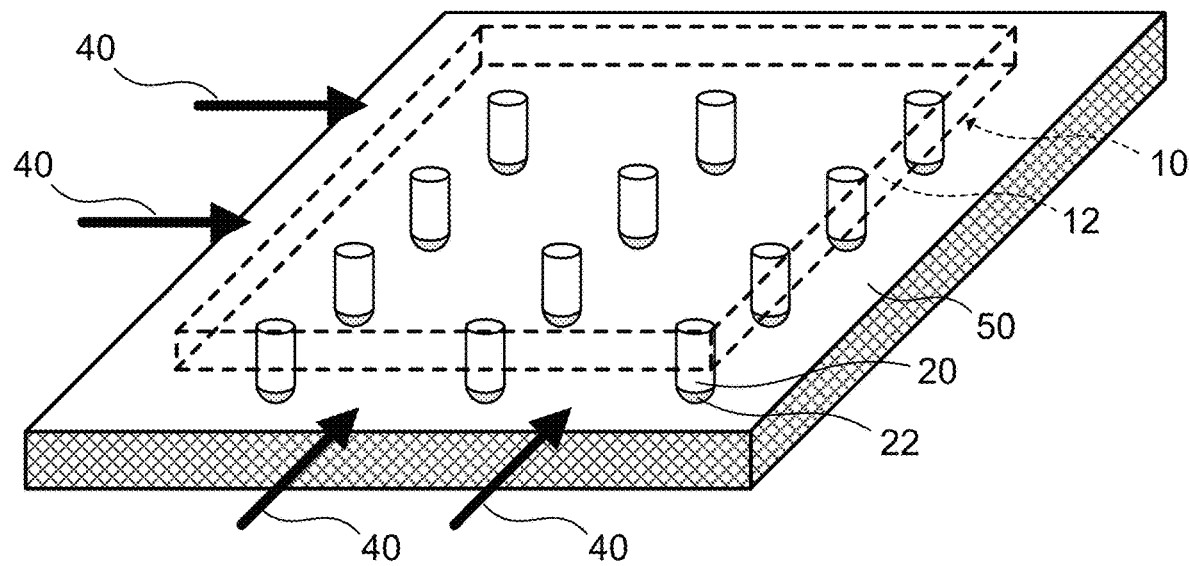
FIG. 1B is an enlarged perspective view showing the semiconductor die of FIG. 1A mounted as a flip-chip to a substrate.

Underfill material applied to a first edge 152 of the semiconductor die 112 perpendicular to the length L will have a flow rate 140, which is similar to the flow rates of the conventional technology of FIG. 1B. The flow rate 140 is based on only the gap size because the underfill material does not interact with the capillary flow structures 130 at the first edge 152.

In contrast, underfill material applied to a second edge 154 of the semiconductor die 112 parallel to the length L of the capillary flow structures 130 will have a higher flow rate depending on the effective area of the passageway through which the underfill material is flowing. In flow passageways adjacent to an open edge of the gap (e.g., the first edge 152), the underfill material will have a flow rate 142 equal to or greater than the flow rate 140. In these passageways, one side of the capillary flow structure 130 influences the capillary force to affect the flow rate 142. In flow passageways where two capillary flow structures 130 straddle the pillars 120 (i.e., a row of pillars 120 is between two of the capillary flow structures 130), the underfill material will have a flow rate 144 equal to or greater than the flow rate 142. In these passageways, the first flow element 131 of one capillary structure 130 and the second flow element 132 of an adjacent capillary structure 130 spaced apart by the width W2 increase the capillary force to increase the flow rate 144. In flow passageways between the first and second flow elements 131 and 132 of an individual flow structure 130, the underfill material will have a flow rate 146 equal to or greater than the flow rate 144. In these passageways, the flow rate 146 is expected to be the highest of the flow rates because lesser first width W1 between the first and second flow elements 131 and 132 creates a higher capillary force to increase the flow rate 146, and also because space between the first and second flow elements 131 and 132 is free of pillars 120. The present technology is accordingly expected to decrease the time required for the underfill to fill across the entire surface area of the upper face of the semiconductor die 112 facing the substrate 150 in a flip-chip configuration.

The present technology also further assists in maintaining the desired spacing between the semiconductor die 112 and the substrate 150 throughout the surface area of the semiconductor die 112. Without the capillary flow structures 130, the semiconductor die 112 can be tilted with respect to the substrate 150 such that one region has a small gap between the semiconductor die 112 and the substrate 150 while another region has a large gap. This can cause shorting between pillars 120 in region with the small gap and disconnects in the region with the larger gap. The capillary flow structures 130 are expected to act as spacers that provide a uniform space between the semiconductor die 112 and the substrate 150. Therefore, the capillary flow structures 130 also enhance the yield.

Figure 3A:
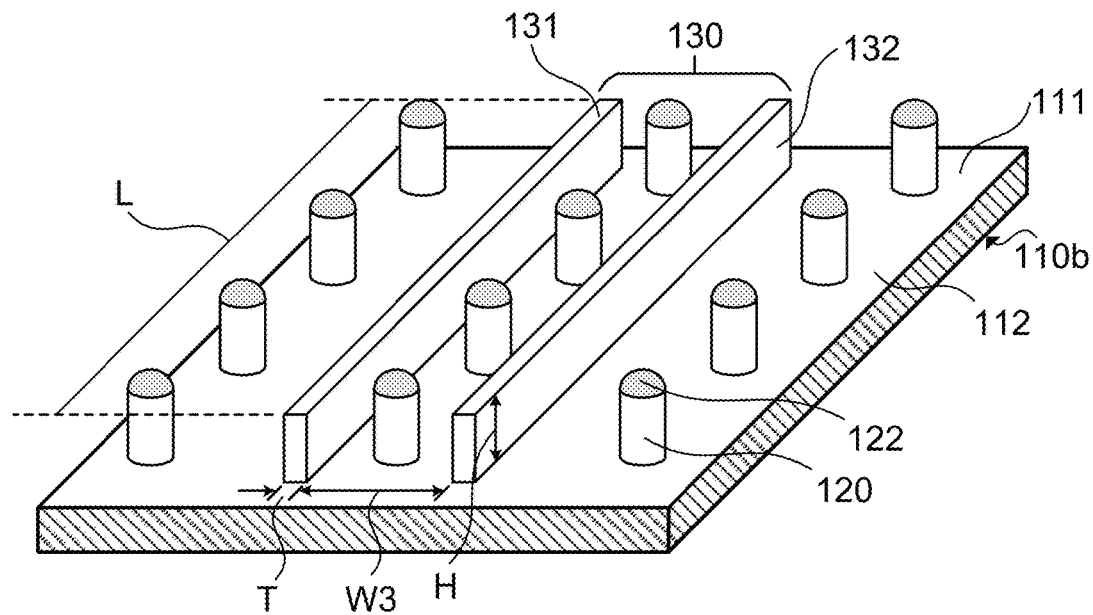
FIG. 3A is an enlarged perspective view showing a semiconductor die having interconnect structures and capillary flow structures configured in accordance with an embodiment of the present technology.

FIG. 3A shows a semiconductor device 110b arranged in a front-side-up configuration. Like reference numbers refer to like components in FIGS. 2A-3B. The semiconductor device 110b includes the semiconductor die 112 with the pillars 120 extending from the front side 111 of the semiconductor die 112 and the solder bumps 122 at a distal end of each pillar 120. The semiconductor device 110b may further include a capillary flow structure 130 with first and second flow elements 131 and 132 projecting away from the front side 111 of the semiconductor die 112 to a height H, and they have a thickness T and a length L. In this embodiment, the first and second flow elements 131 and 132 are spaced from each other by a width W3 such that they straddle a row of pillars 120. The width W3 can be equal to or different than the width W2 of the semiconductor device 110a.

Figure 3B:
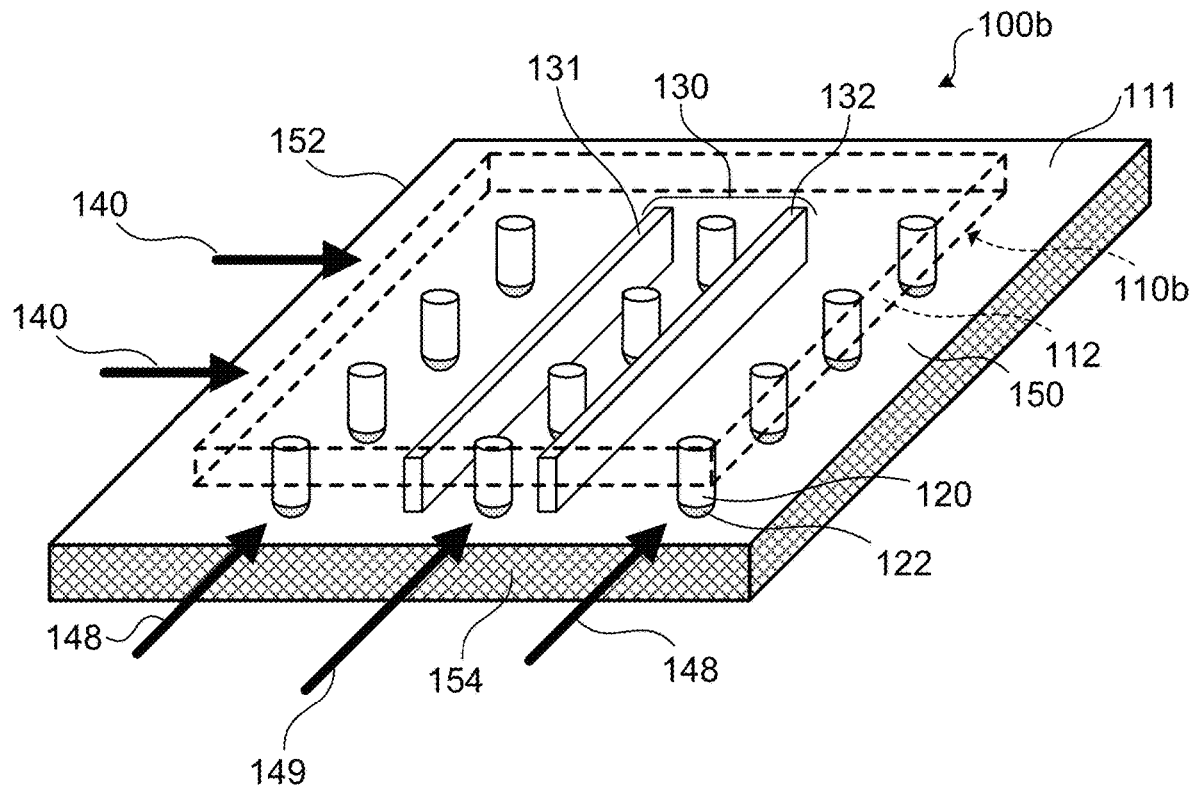
FIG. 3B is an enlarged perspective view showing the semiconductor die of FIG. 3A mounted as a flip-chip to a substrate.

FIG. 3B shows a direct chip attachment assembly 100b with the semiconductor device 110b of FIG. 3A being inverted such that the solder bumps 122 interface with contacts (not shown) on a substrate 150. In this configuration, the capillary flow structure 130 is in a gap between the substrate 150 and the semiconductor die 112. In flow passageways adjacent to an open edge of the gap (e.g., the first edge 152), the underfill material will have a flow rate 148 equal to or greater than the flow rates 140, and equal to or less than the flow rate 142 of the direct chip attachment assembly 110a. In flow passageways between the first and second flow elements 131 and 132, the underfill material will have a flow rate 149. The flow rate 149 may be greater than the flow rate 148, but the presence of the pillars 120 will at least somewhat impede the flow between the first and second flow elements 131 and 132.

Figure 4:
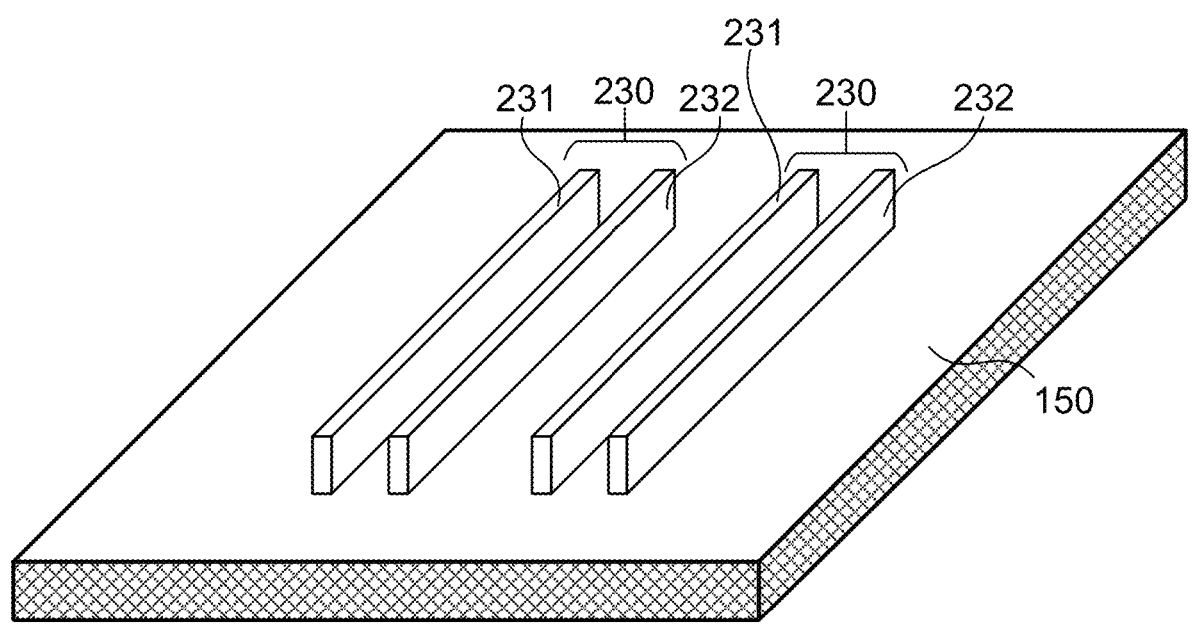
FIG. 4 is an enlarged perspective view showing a substrate having capillary flow structures configured in accordance with an embodiment of the present technology.

FIG. 4 shows a substrate 150 including capillary flow structures 230 projecting away from the substrate 150. The capillary flow structures 230 are similar to the capillary flow structures 130 in FIG. 2A, except the capillary flow structures 230 extend from the substrate 150 instead of the semiconductor die 112. The capillary flow structures 230 can accordingly be spaced apart from each other by a distance that increases the capillary flow rate, and each capillary flow structure 230 can include a first flow element 231 and a second flow element 232 spaced apart from each other by a distance that further increases the capillary flow rate. When the semiconductor device 110a is inverted for direct chip attachment to the substrate 150, the capillary flow structures 230 extend from the substrate 150 at least partially to the front side 111 of the semiconductor device 110a. The configuration of the direct chip attachment assembly in FIG. 2B applies similarly to the substrate shown in FIG. 4, except the capillary flow structures 230 replace the capillary flow structures 130.

The illustrated pillar and capillary flow structure configurations of FIGS. 2A-4 are exemplary and any of the pillars and capillary flow structures may have different shapes, dimensions, or spacing to create the desired underfill flow rates between the dies and substrate.

Figure 5:
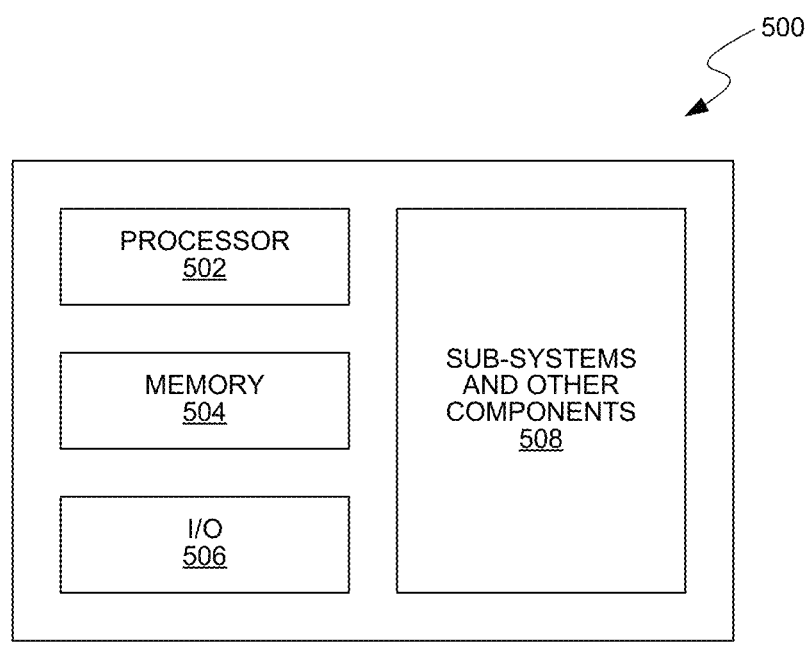
FIG. 5 is a schematic view of a system that includes a semiconductor device configured in accordance with embodiments of the present technology.

FIG. 5 is a block diagram illustrating a system that incorporates a semiconductor device in accordance with embodiments of the present technology. Any one of the semiconductor devices having the features described above with reference to FIGS. 2A-4 can be incorporated into any of a myriad of larger and/or more complex systems, a representative example of which is system 500 shown schematically in FIG. 5. The system 500 can include a processor 502, a memory 504 (e.g., SRAM, DRAM, flash, and/or other memory devices), input/output devices 506, and/or other subsystems or components 508. The semiconductor assemblies, devices, and device packages described above with reference to FIGS. 2A-4 can be included in any of the elements shown in FIG. 5. The resulting system 500 can be configured to perform any of a wide variety of suitable computing, processing, storage, sensing, imaging, and/or other functions. Accordingly, representative examples of the system 500 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 500 include lights, cameras, vehicles, etc. In these and other examples, the system 500 can be housed in a single unit or distributed over multiple interconnected units, e.g., through a communication network. The components of the system 500 can accordingly include local and/or remote memory storage devices and any of a wide variety of suitable computer-readable media.

The present technology includes several advantages over conventional flip-chip underfill procedures. The capillary flow structure configurations of the present technology increase the capillary flow action of the underfill material. In some embodiments, the present technology allows (a) quicker flip-chip underfill processing due to higher underfill material flow rates along the capillary flow structures, (b) increased bonding surface area and mechanical grip for improved semiconductor die adhesion to the substrate, and (c) a reduction in the quantity of underfill material required to mount the semiconductor die to the substrate. The illustrated embodiments depict examples of semiconductor devices using the capillary flow structure configurations of the present technology; however, further device configurations of capillary flow structures are within the scope of the present technology.

As used in the foregoing description, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, left/right, and distal/proximate can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

The foregoing disclosure may also reference quantities and numbers. Unless specifically stated, such quantities and numbers are not to be considered restrictive, but exemplary of the possible quantities or numbers associated with the new technology. Also, in this regard, the present disclosure may use the term "plurality" to reference a quantity or number. In this regard, the term "plurality" is meant to be any number that is more than one, for example, two, three, four, five, etc. For the purposes of the present disclosure, the phrase "at least one of A, B, and C," for example, means (A), (B), (C), (A and B), (A and C), (B and C), or (A, B, and C), including all further possible permutations when greater than three elements are listed.

From the foregoing, it will be appreciated that specific embodiments of the new technology have been described herein for purposes of illustration, but that various modifications may be made without deviating from the present disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the present disclosure. Accordingly, the present disclosure and associated technology can encompass other embodiments not expressly shown or described herein.

I claim:

1. A semiconductor device for direct chip attachment, comprising:
    a substrate;
    a semiconductor die having a conductive pillar extending from a front side, the semiconductor die electrically coupled to the substrate through the conductive pillar, and the front side of the semiconductor die being spaced apart from the substrate by a gap; and
    a capillary flow structure having first and second elongate flow elements projecting from the front side toward the substrate, the first and second elongate flow elements being laterally spaced apart from each other by a first width configured to induce capillary flow of an underfill material along a length of the first and second elongate flow elements,
    wherein surfaces of the first and second flow elements, the substrate, and the front side of the semiconductor die form a first passageway through which the underfill material travels from induced capillary flow.

2. The semiconductor device of claim 1, wherein the first and second elongate flow elements contact the substrate when the semiconductor die is electrically coupled to the substrate.

3. The semiconductor device of claim 1, wherein the first passageway is free from pillars, and wherein an induced capillary flow rate within the first passageway is higher than an induced capillary flow rate within the gap outside of the first passageway.

4. The semiconductor device of claim 1, wherein the conductive pillar is inside the first passageway, and wherein an induced capillary flow rate within the first passageway is higher than an induced capillary flow rate within the gap outside of the first passageway.

5. The semiconductor device of claim 1, further comprising a second capillary flow structure having first and second elongate flow elements projecting from the front side toward the substrate, each of the first and second capillary flow elements of the second capillary flow structure being laterally spaced apart from each other by a second width configured to induce capillary flow of an underfill material along a length of the first and second elongate flow elements of the second capillary flow structure.

6. The semiconductor device of claim 5, wherein:
    surfaces of the first and second elongate flow elements of the second capillary flow structure, the substrate, and the front side of the semiconductor die form a second passageway through which the underfill material travels from induced capillary flow, and
    opposing outer surfaces of the first and second capillary flow structures, the substrate, and the front side of the semiconductor die form a third passageway through which the underfill material travels from induced capillary flow.

7. The semiconductor device of claim 6, wherein an induced capillary flow rate within the first and second passageways is higher than an induced capillary flow rate within the third passageway.

8. The semiconductor device of claim 6, wherein an induced capillary flow rate within the third passageway is higher than an induced capillary flow rate within the gap outside of the first, second, and third passageways.

9. A semiconductor device for direct chip attachment, comprising:
    a substrate;
    a semiconductor die having a conductive pillar extending from a front side, the semiconductor die electrically coupled to the substrate through the conductive pillar, and the front side of the semiconductor die being spaced apart from the substrate by a gap; and
    first and second capillary flow structures each having first and second elongate flow elements projecting from the front side toward the substrate, the first and second capillary flow structures being laterally spaced apart from each other by a first width configured to induce capillary flow of an underfill material between the first and second capillary flow structures,
    wherein the first and second capillary flow structures contact the substrate when the semiconductor die is electrically coupled to the substrate.

10. The semiconductor device of claim 9, wherein the first and second elongate flow elements of the first capillary flow structure are laterally spaced apart from each other by a second width, and wherein the first and second elongate flow elements of the second capillary flow structure are spaced apart from each other by a third width.

11. The semiconductor device of claim 10, wherein the first width is greater than the second and third widths.

12. The semiconductor device of claim 9, wherein the first and second elongate flow elements of the first capillary flow structure, the substrate, and the front side of the semiconductor die form a first passageway through which the underfill material travels from induced capillary flow, and wherein the first and second elongate flow elements of the second capillary flow structure, the substrate, and the front side of the semiconductor die form a second passageway through which the underfill material travels from induced capillary flow.

13. The semiconductor device of claim 12, wherein the first and second passageways are free from pillars, and wherein an induced capillary flow rate within either of the first and second passageways is higher than an induced capillary flow rate within the gap outside of the first passageway.

14. The semiconductor device of claim 12, wherein opposing outer surfaces of the first and second capillary flow structures, the substrate, and the front side of the semiconductor die form a third passageway through which the underfill material travels from induced capillary flow.

15. The semiconductor device of claim 14, wherein the conductive pillar is inside the first passageway, and wherein an induced capillary flow rate within the first passageway is higher than an induced capillary flow rate within the gap outside of the first passageway.

16. The semiconductor device of claim 14, wherein an induced capillary flow rate within the first and second passageways is higher than an induced capillary flow rate within the third passageway.

17. The semiconductor device of claim 14, wherein an induced capillary flow rate within the third passageway is higher than an induced capillary flow rate within the gap outside of the first, second, and third passageways.

\* \* \* \* \*